(12) United States Patent
Sandtner (10) Patent No.: US 8,492,072 B2
(45) Date of Patent: Jul. 23, 2013

(54) METHOD FOR MARKING OBJECTS

(75) Inventor: Klaus Heinz Sandtner, Villach (AT)

(73) Assignee: Infineon Technologies AG, Neubiberg (DE)

(*) Notice: Subject to any disclaimer, the term of this patent is extended or adjusted under 35 U.S.C. 154(b) by 301 days.

(21) Appl. No.: 12/432,990

(22) Filed: Apr. 30, 2009

(65) Prior Publication Data

US 2010/0279231 A1 Nov. 4, 2010

(51) Int. Cl.
*G03F 7/20* (2006.01)

(52) U.S. Cl.
USPC ............. 430/293; 430/311; 430/312; 430/15

(58) Field of Classification Search
None
See application file for complete search history.

(56) References Cited

U.S. PATENT DOCUMENTS

| | | | |
|---|---|---|---|
| 3,751,248 A * | 8/1973 | Goell | 430/312 |
| 4,095,095 A * | 6/1978 | Muraoka et al. | 235/375 |
| 4,182,559 A * | 1/1980 | Driscoll et al. | 396/318 |
| 4,510,673 A * | 4/1985 | Shils et al. | 438/15 |
| 5,129,974 A * | 7/1992 | Aurenius | 156/64 |
| 5,357,077 A * | 10/1994 | Tsuruta | 219/121.68 |
| 5,517,266 A * | 5/1996 | Funaki et al. | 396/319 |
| 5,812,895 A * | 9/1998 | DuVall et al. | 396/318 |
| 5,997,388 A * | 12/1999 | Canella et al. | 451/67 |
| 6,063,685 A | 5/2000 | Steffan et al. | |
| 6,200,386 B1 * | 3/2001 | Canella | 118/620 |
| 6,455,998 B1 * | 9/2002 | Moh et al. | 313/477 R |
| 6,556,273 B1 * | 4/2003 | Wheeler et al. | 352/92 |
| 6,734,032 B2 * | 5/2004 | Tandy et al. | 438/26 |
| 7,229,720 B2 * | 6/2007 | Hamada | 430/1 |
| 2001/0035597 A1 * | 11/2001 | Grigg et al. | 264/401 |
| 2002/0003613 A1 * | 1/2002 | Mori et al. | 355/18 |
| 2002/0107603 A1 * | 8/2002 | Canella | 700/121 |
| 2002/0179718 A1 * | 12/2002 | Murokh et al. | 235/487 |
| 2003/0033101 A1 * | 2/2003 | Raitter | 702/81 |
| 2003/0175625 A1 | 9/2003 | Salmi | |
| 2003/0203591 A1 * | 10/2003 | Corbett | 438/401 |
| 2004/0110313 A1 * | 6/2004 | Matsunami | 438/14 |
| 2005/0042780 A1 | 2/2005 | Matsunami | |
| 2006/0008743 A1 * | 1/2006 | Jux et al. | 430/320 |
| 2007/0138252 A1 * | 6/2007 | Lee et al. | 235/375 |

FOREIGN PATENT DOCUMENTS

| | | | |
|---|---|---|---|
| GB | 2448764 | * | 10/2008 |
| JP | 04-158506 | * | 6/1992 |
| JP | 11-204669 | * | 7/1999 |
| WO | 2007/114829 | * | 10/2007 |

OTHER PUBLICATIONS

"IBM Researcher Fabricate NANO-LED", J.A. Misewich, et al., Science, vol. 300, p. 783.
Mini light emitting diode in a gold shelve, Nature Phonics.
Fast and efficient way to photonic nano components, Nano Letters.
Harvard researchers introduce a concept of "Nano Light Emitting Diodes", Nature, vol. 415, p. 620.

* cited by examiner

*Primary Examiner* — Martin Angebrannt
(74) *Attorney, Agent, or Firm* — Dicke, Billig & Czaja, PLLC (57) ABSTRACT

A description is given of methods and devices for product marking of objects using a light-sensitive layer applied to the objects and a light source. The invention may be used, for example, to simultaneously mark or label a first plurality of objects at a first time with individual marks or labels, and to mark or label a second plurality of objects at a second time with individual marks or labels.

16 Claims, 9 Drawing Sheets

METHOD FOR MARKING OBJECTS

BACKGROUND OF THE INVENTION

The invention relates to the technique of marking or labeling objects. In particular, the invention relates to marking or labeling chips.

It may be desirable to provide information on objects for a variety of purposes. For example, it may be necessary to provide information on a package such as e.g. a box for describing the content or other specifications of the item within the packing. It may also be necessary to mark or label objects for the purpose of product identification, e.g. for being able to distinguish objects from each other or to trace individual objects in a production process. Flexibility and cost are important parameters in product marking technology.

For these and for other reasons there is a need for the present invention.

BRIEF DESCRIPTION OF THE DRAWINGS

The accompanying drawings are included to provide a further understanding of embodiments and are incorporated in and constitute part of this specification. The drawings illustrate embodiments and together with the description serve to explain principles of embodiments. Other embodiments and many of the intended advantages of embodiments will be readily appreciated as they will become better understood by reference to the following detailed description. The elements of the drawings are not necessarily to scale relative to each other. Like reference numerals designate corresponding similar parts.

DETAILED DESCRIPTION OF THE INVENTION

In the following detailed description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The embodiments described in the following relate to methods and devices for marking or labeling objects. The objects that are to be marked or labeled may generally be of any kind. They may for example be products such as e.g. semiconductor chips, insulators, semiconductor packages, mold material, or any other products. Further, they may for example be packages of products made e.g. of cardboard, plastic, metal or other packaging materials, or they may be substrates of labels, wherein the labels are intended to be attached to products or packages of products. Substrates of labels may e.g. be configured as paper sheets or plastic foils.

As used in this specification, the terms "mark" or "label" or "visible mark" or "visible label" are not meant to be limited to marks or labels that are visible to the human eye. These terms also refer to marks or labels that are only visible under certain circumstances or may be made visible by applying particular means, e.g. by applying black light or using particular detection means. The terms also refer to marks or labels that are machine readable. The labels or marks may be too small or may have too low contrast for being visible to the bare human eye.

In embodiments described herein, one or several marks or labels are applied onto one or several objects. A mark or label may, for example, consist of one or a plurality of two-dimensional structures such as symbols or signs, including e.g. letters, numbers, bar codes, dot codes etc. A mark or label may consist of simple geometric structures such as bars, dots, circles, rectangles, lines, or any other two dimensional structures. It may also be possible to use a plurality of simple geometric structures such as e.g. bars, dots or filled circles to compose more complex structures such as e.g. letters or numbers or other symbols or signs.

The objects (i.e. products, product packages or labels) that are to be marked or labeled may have a surface made of a light-sensitive material. For example, the object itself may be formed from light-sensitive material, i.e. the object itself may be light-sensitive. As another example, the objects may be covered with one or several layers of light-sensitive material or materials.

The light-sensitive materials may be sensitive to specific ranges of wavelengths of light, e.g. wide or small ranges of wavelengths. Different light-sensitive layers reacting upon different wavelengths may be used, for example to generate different colors or to generate labels or marks in different layers.

Correspondingly, different light sources emitting light at different wavelengths and/or with different wavelength spectra or one light source operable to emit light of different wavelengths and/or with different wavelength spectra may be used. For example, ultraviolet (UV) light sources such as a mercury (Hg) light source emitting light on the Hg I-line (365 nm) may be used. It may also be feasible to use optical filters to obtain only light with a desired wavelength, e.g. by absorbing or eliminating undesired wavelengths. By way of example, in one embodiment, the light source may be a two-dimensional color display operable to emit light of different wavelengths with respect to time and display location. Alternatively, in another embodiment, the light source may be a two-dimensional black/white display.

The labels or marks to be applied to the objects must not necessarily cover the entire surfaces of the objects that are to be marked or labeled, i.e. each object does not have to be completely exposed by light and does not have to be completely covered with a layer of light-sensitive material. For example, it may be provided that the labels or marks are only applied to a small portion of the surfaces of the objects. If the area that is to be marked or labeled is smaller than the size of the object, only portions of the objects may have to be exposed by light and/or covered with a light-sensitive material.

The light source may emit one or a plurality of light patterns each corresponding to one mark or label.

The light source may have lateral dimensions smaller than, similar to or greater than one object or area on one object that is to be exposed. For example, in one embodiment, the light source may have lateral dimensions smaller than the area on one object that is to be exposed. In this case, the light source may be moved relative to the object in order to completely expose that area in a sequential manner using a multi-exposure approach for applying one mark or label to one object. In one embodiment, the light source may have a size similar or equal to the area on the object that is to be exposed, and may be configured to expose this area simultaneously, i.e. at one time by common exposure. In this case, one mark or label may be applied to one object by one exposure. After such exposure, the light source may be moved in lateral direction relative to the object to expose one area of another object, possibly with another light pattern corresponding to another mark or label. Further, the light source may also be configured to (simultaneously) emit a plurality of light patterns each corresponding to a mark or label. If the light source is configured to emit a plurality of light patterns, the light source may simultaneously apply marks or labels to a plurality of objects. The light source may be used to apply marks or labels to an array of objects, either by one common exposure of all objects of the array or in a sequential manner using a multi-exposure approach by moving the light source over the array of objects and exposing the objects group by group.

The light source may have lateral dimensions smaller than, similar to or greater than the lateral dimensions of an array of objects. In one embodiment, the light source may have one or more lateral dimensions that allow to expose two or more objects or corresponding areas on these objects simultaneously, i.e. to generate a plurality of marks or labels on a plurality of objects at the same time with a common exposure (common shot). In that case, a number of marks or labels, which may be different to one another, may be applied to the several objects with a common, e.g. single exposure, i.e. by parallel processing. Further, the light source may have one or more lateral dimensions similar to or greater than one or more lateral dimensions of the array of objects, or the light source may have one or more lateral dimensions greater than one or more lateral dimensions of the array of objects. In both cases, all objects of the array may be marked or labeled by common exposure (e.g. one shot), i.e. by parallel processing, wherein all marks or labels may optionally be different to one another. Further, in a subsequent step, when objects of another array of objects are marked or labeled by parallel processing using common exposure, all marks or labels may again be different to one another and may be different to all marks or labels applied to the array of objects in the preceding step.

Arrays of arbitrary objects may be labeled or marked by the techniques described herein. By way of example, an array of objects such as e.g. a wafer, an artificial wafer, an array of packages or a sheet substrate comprising a plurality of areas which are intended to form labels after marking may be processed.

The light source may emit light in different ways. In one embodiment, the light source may have a plurality of light emitting elements distributed across a two-dimensional light emitting area of the light source. For example, the light emitting elements may be arranged in an array having a given pitch or resolution. Each of the light emitting elements may be individually controlled by a common controller such that e.g. the activation/deactivation, duration of activation, light intensity, etc. may be controlled individually for each of the light emitting elements. By way of example, the light source may be a LED (light emitting diode) display having a plurality of light emitting diodes, and the controller may be configured to control the light emitted by every single LED or pixel. The light emitting elements may be extremely small, e.g. may be so-called light emitting nano-diodes with a size ranging from fractions of 1 μm up to about 1 mm or more. The light source may comprise one or more wafers with a plurality of such light emitting nano-diodes arranged on one face of the wafer or wafers.

In one embodiment, the light source may have one or several large light generating elements forming a background illumination, and a plurality of light shading elements may then be used to generate the desired light pattern(s). Each of the light shading elements may be controlled individually as described above. For example, the light source may be a LCD (liquid crystal display).

FIGS. 1A to 1G schematically illustrate a method of simultaneously marking or labeling a plurality or array 110 of objects 100. By way of example, but without loss of generality, the objects 100 will be assumed to be semiconductor chips 100 in the following. However, it is to be understood that this embodiment is not meant to limit the scope of the present invention to semiconductor chips as objects 100 to be marked or labeled.

Figure 1A:
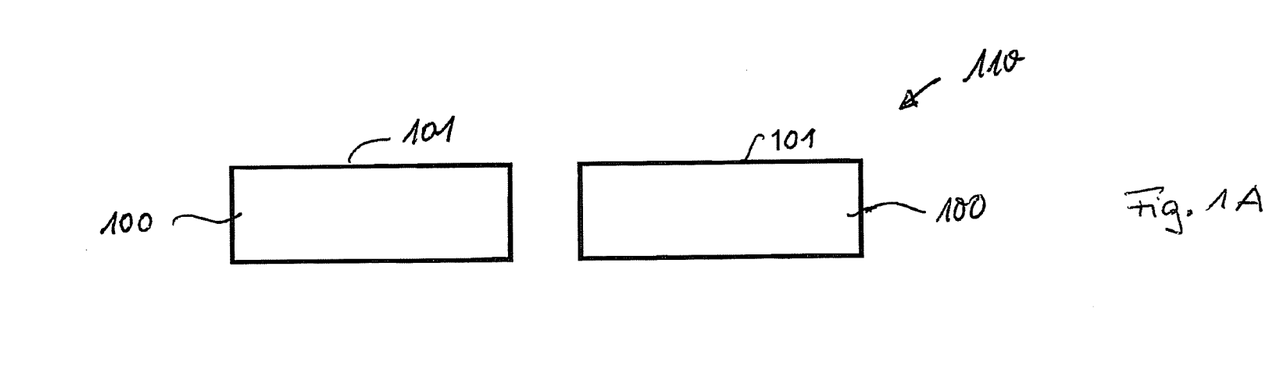
FIGS. 1A to 1G schematically illustrate an embodiment of a method of simultaneously applying labels or marks onto at least two semiconductor chips.

As shown in FIG. 1A, an array 110 of semiconductor chips 100 having a first surface 101 onto which a mark or label is to be applied is provided. The semiconductor chips 100 may be arranged side by side and may be spaced apart by an arbitrary distance. For example, the semiconductor chips 100 may be positioned on a carrier (not shown). In one embodiment, the semiconductor chips 100 may be embedded in a molding material (not shown) which fills the gaps between the semiconductor chips 100 and which provides for a rigid array 110 of embedded semiconductor chips 100. Such a molded body is often referred to as artificial or reconfigured wafer in the art, and may be used to provide for so-called fan-out semiconductor packages when later divided into single units each comprising one or more semiconductor chips 100. In one embodiment, the semiconductor chips 100 shown in FIG. 1A may still be part of an integral semiconductor wafer (not shown). In this case, they may be spaced apart typically by only a small distance corresponding to e.g. the width of a dicing street applied during later chip separation. The array 110 of semiconductor chips 100 shown in FIG. 1A may comprise more than two semiconductor chips 100, for instance more than e.g. 50 or 100 semiconductor chips 100.

Figure 1B:
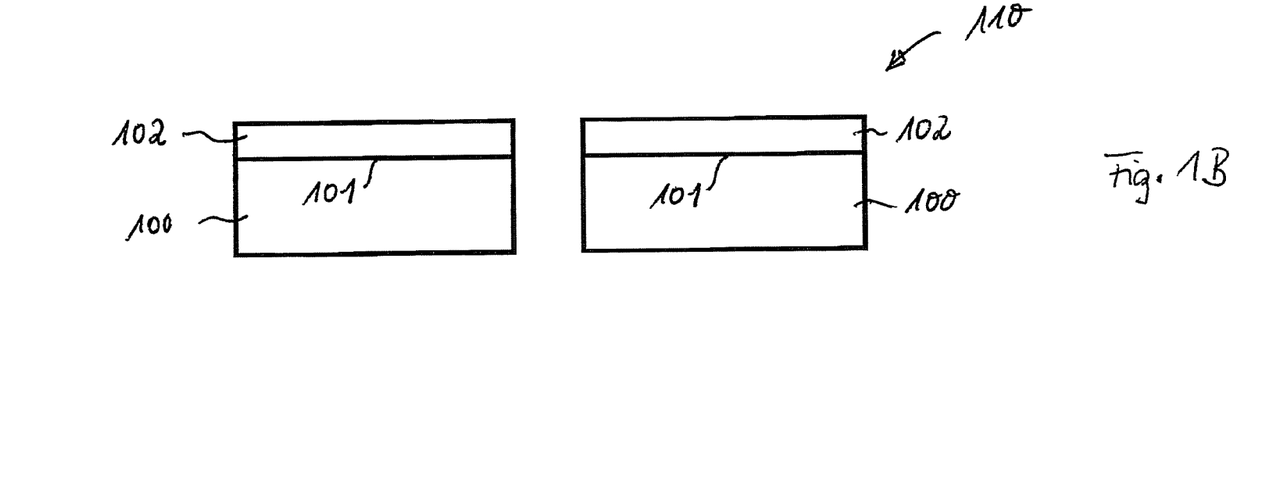

In FIG. 1B, a light-sensitive layer 102 such as e.g. a photoresist layer is deposited onto the first surface 101 of the semiconductor chips 100. The light-sensitive layer 102 may be applied over the whole surface 101 of the chips 100 or may be applied only over a portion of the surface 101, for example if only a portion of the surface 101 is to be labeled or marked. The light-sensitive layer 102 may consist of one or a plurality of materials and/or layers.

If the array of semiconductor chips 100 is made of one piece (e.g. in the case of a semiconductor wafer or an artificial wafer), the light-sensitive layer 102 may also be applied to cover the gaps between the semiconductor chips 100. The light-sensitive layer 102 may be applied by any appropriate technique, for example by spin-coating or by printing such as e.g. stencil printing or pad printing.

Figure 1C:
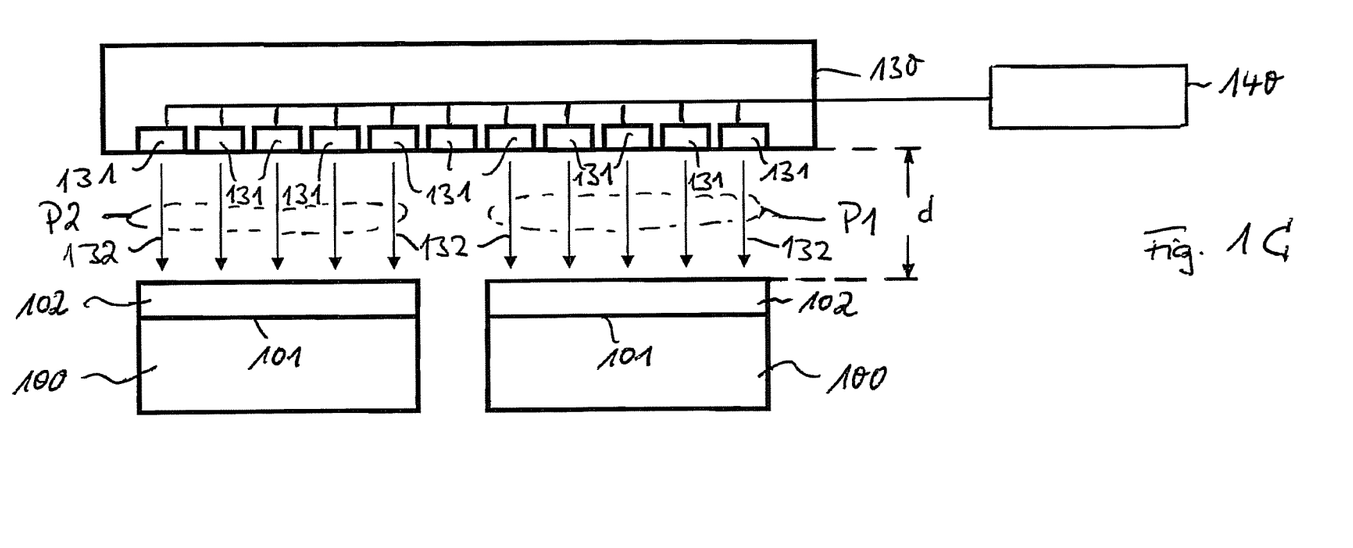

In the embodiment shown in FIG. 1C, a light source 130 is positioned a distance d over the light-sensitive layer 102. The light source 130 includes a plurality of light emitting elements 131, e.g. diodes, nano-diodes, etc. The light emitting elements 131 may, for example, be arranged in an array having a desired pitch or resolution. For example, the light source 130 may be a two-dimensional LED display with a plurality of LED cells arranged across the display.

In one embodiment, the light source 130 may be a semiconductor wafer that is equipped with a plurality of light emitting diodes (LEDs) on the side facing the array 110 of semiconductor chips 100. Such semiconductor wafer then acts as a two-dimensional display emitting for each semiconductor chip 100 an (optionally unique) light pattern P1, P2.

In one embodiment, the light source 130 may be a LCD display having e.g. a background light, polarization filters and liquid crystal cells (corresponding to the light emitting elements 131 in FIG. 1A) for controlling the amount of light passing through the various cells.

The distance d between the light-sensitive layer 102 and the light source or display 130 may range from 0 µm to 10 µm or 20 µm or 50 µm or 100 µm or 500 µm or 1 mm or 10 mm or 100 mm. In one embodiment, the light source 130 may virtually be in touch with the light-sensitive layer 102, i.e. may have a distance d=0 to the light-sensitive layer 102. In this case, the light patterns P1, P2 generated at the display (light source 130) are transferred to the light-sensitive layer 102 by direct projection of light 132. In other embodiments, the light patterns P1, P2 generated by the light source 130 may be reproduced on the light-sensitive layer 102 by an optical system (not shown in FIG. 1C) which may comprise collective or diverging lenses for scaling-down or scaling-up the size of the light patterns P1, P2 when being reproduced on the light-sensitive layer 102.

Further referring to FIG. 1C, a controller 140 may be used to individually control the various light emitting elements 131. The controller 140 may individually control the amount of light 132 emitted by each light emitting element 131, the duration of activation, the emitted light intensity, etc. This way, by activating specific light emitting elements 131, two or more desired light patterns P1, P2 may be emitted from the light source 130. The light patterns P1 and P2 hit on the light-sensitive layer 102 on the respective semiconductor chips 100 such that only desired portions of the light-sensitive layer 102 corresponding to the emitted light patterns P1 or P2 are exposed.

In FIGS. 1D through 1G, without loss of generality, it is assumed by way of example that the light-sensitive layer 102 is a photoresist. Different types of photoresist may be used. For example, photoresists may differ with regard to their sensitivity to different wavelengths. For example, a photoresist sensitive to light in the UV range may be used.

Figure 1D:
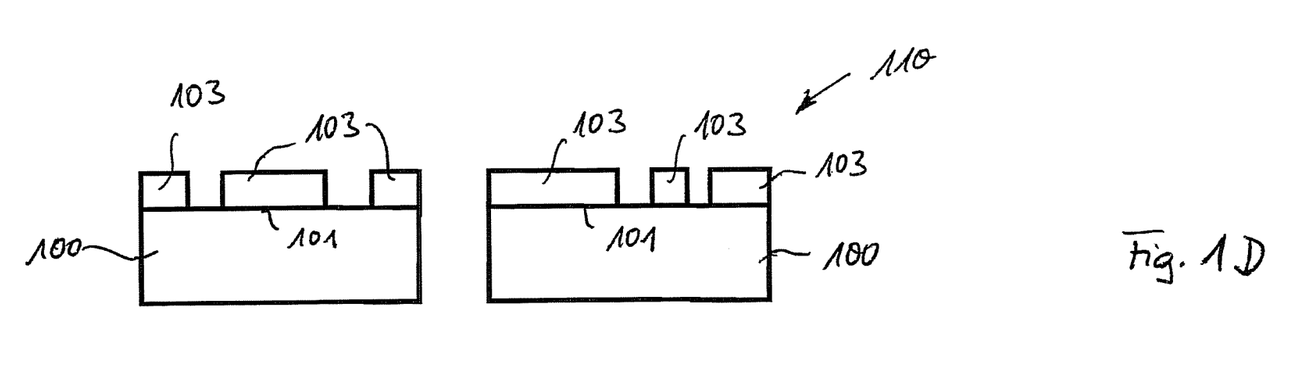

In the embodiment shown in FIGS. 1D to 1G, by way of example, the photoresist 102 is a positive photoresist. A positive resist is a type of photoresist in which the portion of the photoresist that is exposed to light becomes soluble to a photoresist developer, whereas the portion of the photoresist that is unexposed remains insoluble to the photoresist developer. The soluble portions may then be removed so that only the unexposed portions remain on the semiconductor chips 100 and form a structured photoresist layer 103 as shown in FIG. 1D. The structured photoresist layer 103 reproduces the light patterns P1 and P2 generated at the light source 130, optionally in a scaled-down or scaled-up size relationship. A post-baking process may then be applied to stabilize the remaining portions of the structured photoresist layer 103, e.g. by applying heat.

The photoresist layer 102 may also be a negative photoresist. A negative photoresist is a type of photoresist in which the portion of the photoresist that is exposed to light becomes relatively insoluble to the photoresist developer. The unexposed portion of the photoresist is dissolved by the photoresist developer. The soluble portions may be removed so that only the exposed portions remain on the chips 100 and form a structured photoresist layer.

Figure 1E:
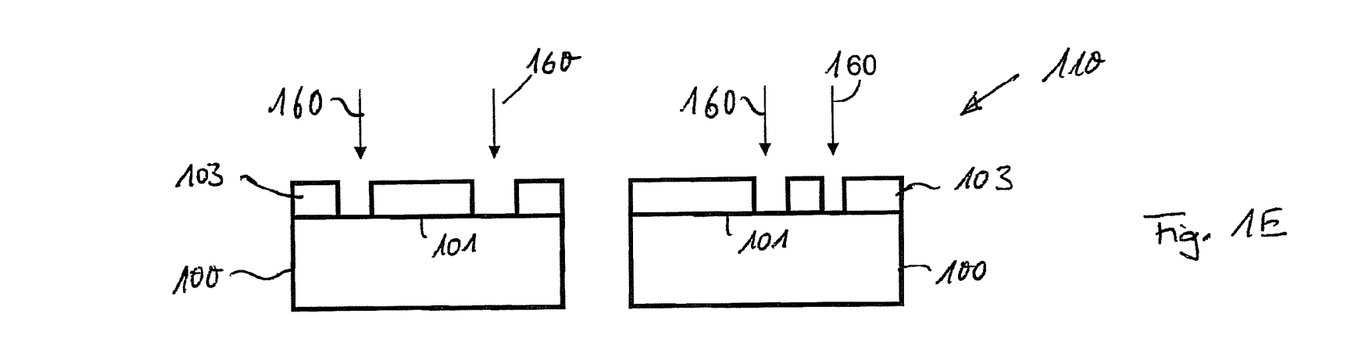
Figure 1F:
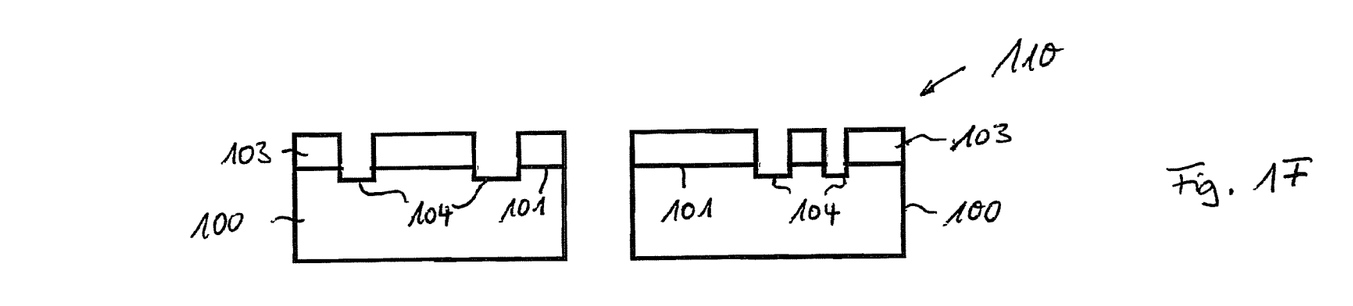

As shown in FIG. 1E, the structured photoresist layer 103 may then be used as a mask layer in a subsequent etching process. An etchant 160 that etches the surface 101 of the semiconductor chips 100 is applied to the structured photoresist layer 103. The etchant 160 may, for example, be applied for a short period so that only the mere surface of the semiconductor chips 100 is attacked. However, it may also be possible to apply the etchant 160 for a longer time such that the surface of the semiconductor chip is recessed. For instance, a given fraction of an upper surface layer (not shown, e.g. a hard passivation layer such as e.g. silicon oxide or silicon nitride) of the semiconductor chips 100 or the entire upper surface layer or several of upper surfaces layers of the semiconductor chips 100 may be etched. In other words, it may be provided that the etchant 160 only reduces the thickness of an upper surface layer of the semiconductor chips 100 or that the etchant 160 opens one or more upper surface layers of the semiconductor chips 100. This way, a visual mark or label may be generated by changing the surface properties such as, for example, reflectivity, or by generating depressions in the top surface or by etching the top surface such that a contrast with a lower layer of the semiconductor chip 100 becomes visible. FIG. 1F schematically illustrates an embodiment in which the reflectivity of the surface 101 has been changed at the openings of the structured photoresist layer 103 to generate a reflectivity pattern 104 according to the desired label or mark.

Figure 1G:
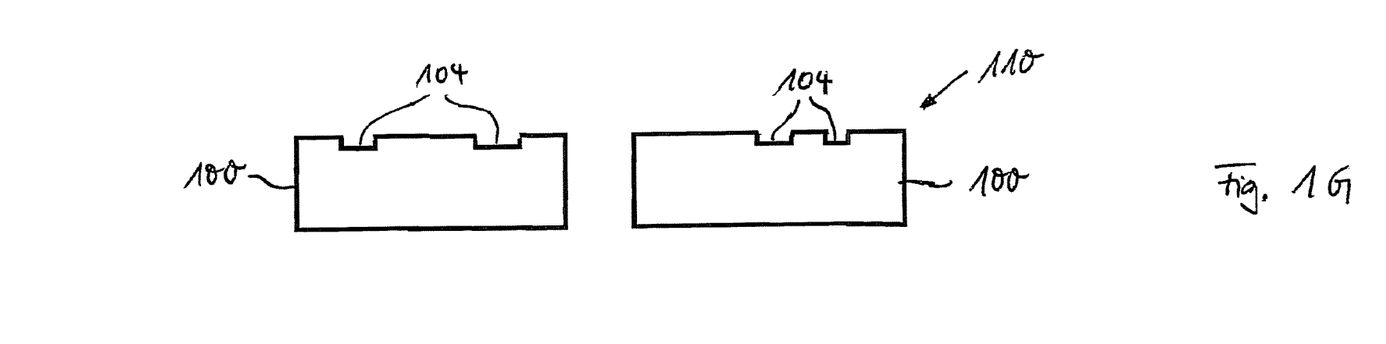

As shown in FIG. 1G, the structured photoresist layer 103 may then be removed, resulting in an array 110 of labeled chips 100.

As already mentioned, in the method of labeling or marking a plurality of semiconductor chips 100 as shown in FIGS. 1A to 1G, a light source 130 may be used that exposes one chip 100, chip groups or all chips 100 of the array 110 of semiconductor chips 100 at the same time.

Figure 2:
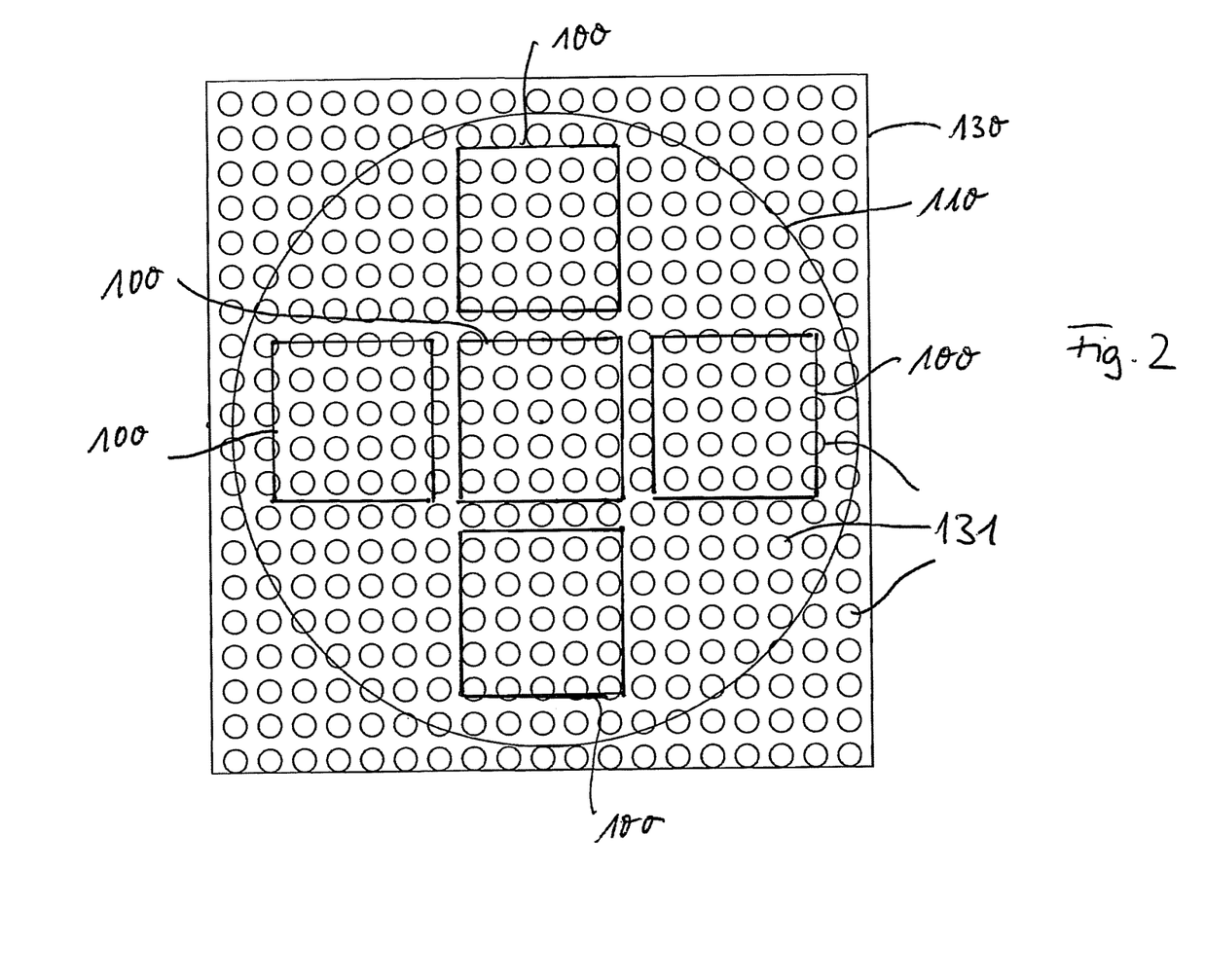
FIG. 2 schematically illustrates a conceptual illustration of a light source with a plurality of light emitting elements positioned over an array of semiconductor chips according to an embodiment.

FIG. 2 is a conceptual plan view showing an array of semiconductor chips 100 such as e.g. a semiconductor wafer or an artificial wafer 110 and a light source 130 having light emitting elements 131 (not drawn to scale) completely covering the semiconductor wafer or artificial wafer 110. As already mentioned, an artificial wafer 110 may be obtained by dicing the semiconductor chips 100 of a semiconductor wafer, re-arranging the diced semiconductor chips 100 on a carrier and embedding the semiconductor chips 100 in a molding compound such as e.g. a resin or plastics material. In the embodiment shown in FIG. 2, all the semiconductor chips 100 may be exposed by the light source 130 simultaneously. The semiconductor chips 100 may be of different type and functionality and do not necessarily have to be of the same size. Each semiconductor chip 100 in one semiconductor wafer or artificial wafer 110 may be labeled with a different label or mark and the labels or marks may optionally be placed at different locations on the various semiconductor chips 100. A controlling circuit 140 (not shown in FIG. 2) may control the light emitting elements 131 such that the light patterns P1, P2 representing the various desired labels or marks are generated and applied to the plurality of semiconductor chips 100 on the semiconductor wafer or artificial wafer 110.

The array 110 of semiconductor chips 100 (e.g. semiconductor wafer or artificial wafer 110) may have a diameter in the order of e.g. centimeters or tens of centimeters, e.g. 20 cm, 30 cm or more. Accordingly, the light source 130 may have similar lateral dimensions, e.g. about 20 cm×20 cm, 30 cm×30 cm or more. If an optical system is used, the light source 130 may for example be larger or smaller than the semiconductor wafer or artificial wafer 110 in one or both lateral dimensions. In particular, if an optical system is used which scales down the dimensions of the light patterns P1, P2 as generated by the light source 130, the pitch constraints of the light emitting elements 131 may be relaxed. By way of example, the light source 130 may be about twice as large as the semiconductor wafer or artificial wafer 110 or even larger, i.e. may have a lateral size of about e.g. 40 cm×40 cm, 60 cm×60 cm, 1 m×1 m, or more.

Figure 3:
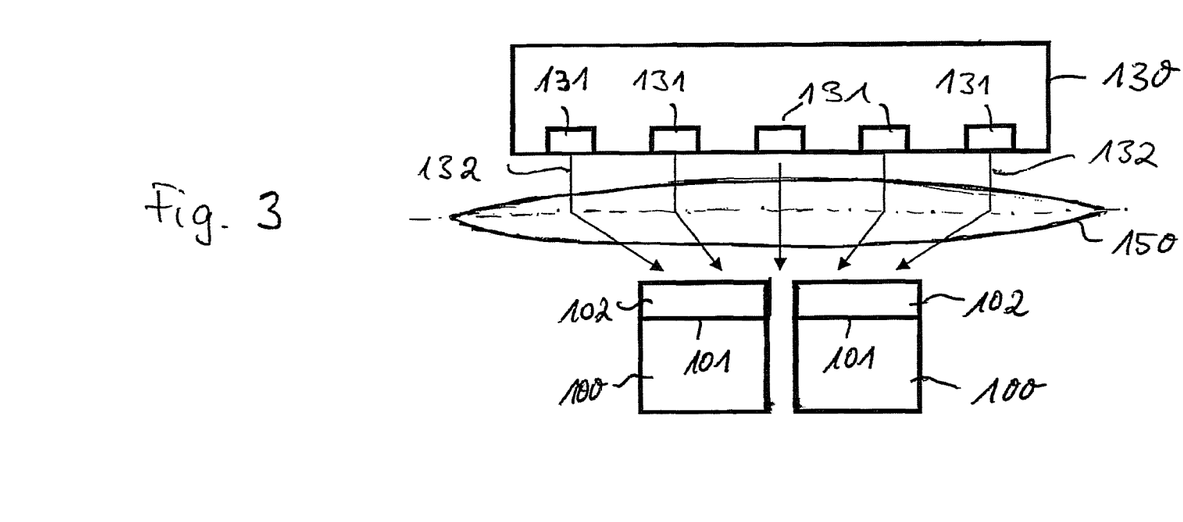
FIG. 3 schematically illustrates a cross-sectional view of an array of semiconductor chips with a light-sensitive layer and a light source with an optical system according to one embodiment.

FIG. 3 shows an arrangement similar to the arrangement in FIG. 1C, however using an optical element 150 between the light source 130 and the array 110 of objects 100, e.g. array of semiconductor chips such as e.g. a semiconductor wafer or an artificial wafer. The light source 130 may be larger in size in view of one or more of its lateral dimensions than the array 110 of semiconductor chips 100. The optical element 150 may be configured to focus the light 132 of the light source 130 onto the array 110 of semiconductor chips 100 in order to generate marks or labels that are smaller than the size of the light pattern emitted by the light source 130. Thus, the optical element 150 may be used to generate marks or labels with a resolution (e.g. dots per inch, dpi) that is higher than the resolution of the light emitting elements 131 provided by the light source 130. This way, very small marks or labels may be generated on the semiconductor chips 100 or semiconductor packages. It will be understood that a plurality of optical elements 150 may be used to generate the desired optical image on the array 110 of semiconductor chips 100, e.g. a plurality of optical elements 150 arranged in parallel or in a serial relationship.

In one embodiment, the optical element 150 may be used to enlarge the image of the light source 130, so that a small light source may be used to expose an array 110 of semiconductor chips 100, that may then be larger in size than the light source 130 in view of one or more of the lateral dimensions.

In one embodiment, an optical element such as a mirror may be used to guide a light pattern generated by the light source 130 towards an object 100 that is to be labeled or marked. Generally, the optical element may be a refractive, diffractive or reflective optical element.

In one embodiment, the light source 130 may be controlled or configured to apply the same label or mark to all the semiconductor chips 100, e.g. the name of the producer.

In one embodiment, the light source 130 may be controlled or configured to apply a different label or mark to each of the semiconductor chips 100 of one array 110 of semiconductor chips 100.

In one embodiment, the light source 130 may be controlled or configured to apply a different label or mark to each of the semiconductor chips 100 of each array 110 of semiconductor chips 100, e.g. an individual chip number and an individual wafer or artificial wafer number. Thus, each of the semiconductor chips 100 may be labeled with an unique identifier. By way of example, each semiconductor chip 100 may be marked with an unique mark or label identifying the wafer or artificial wafer 110 and, for instance, the location of the chip 100 on this wafer or artificial wafer 110. Accordingly, the embodiments described herein may be performed without using photo masks that have to be produced in advance and that do not allow to label each semiconductor chip 100 with an individual label or mark at least for practical reasons because of the high costs required to produce photo masks.

It may be provided that the labels or marks are not only different from each other but may also be applied at different positions on the various semiconductor chips 100. For example, the position of the respective labels, the layout of the respective wafer or artificial wafer 110 or any other positional information my be programmed into the controller 140 of the light source 130 and according light patterns P1, P2, . . . may then be generated. The positions of the labels or marks as well as the information contained in the labels or marks may vary from chip to chip and from (artificial) wafer to (artificial) wafer, i.e. may be chosen completely individual for a each semiconductor chip 100.

The method may be used to label the front side containing the active surfaces of the chips 100 and/or the backside opposite thereto of a semiconductor wafer or artificial wafer 110.

In one embodiment, the light source 130 may only cover or extend over one or a few semiconductor chips 100 of the array 110 and may be moved over the array 110 of semiconductor chips (e.g. the semiconductor wafer or artificial wafer 110) to expose portion by portion of the array 110 in a sequential manner. In other words, the light source 130 may be stepped over the array 110 of semiconductor chips 100 to expose the array 110 chip by chip or chip group by chip group. Also in this embodiment, the light source 130 may be controlled or configured to apply an individual or unique label or mark to each single semiconductor chip 100 of one or a plurality of arrays 110 of semiconductor chips 100.

The above method may be performed such that a photoresist layer pre-used for processing of the semiconductor chips 100 is used a second time for the labeling described above, i.e. a photoresist layer that is used e.g. for generating electrical connections is also used for the product labeling process.

The above method may also be performed such that a first photoresist layer is used for processing of the semiconductor chips 100 and that a second photoresist layer is used for the labeling described above. The first photoresist layer may be sensitive to first wavelengths and the second photoresist layer may be sensitive to second wavelengths. Light sources 130 emitting different wavelength spectra may then be used to structure the two photoresist layers independent of each other.

FIGS. 4A to 4D show top views of exemplary labels or marks. The examples in FIGS. 4A to 4D show different labels or marks for a semiconductor chip 100 of type VE905138, wafer number 50, shot number 13 and chip coordinates on the wafer x=12 and y=15.

Figure 4A:
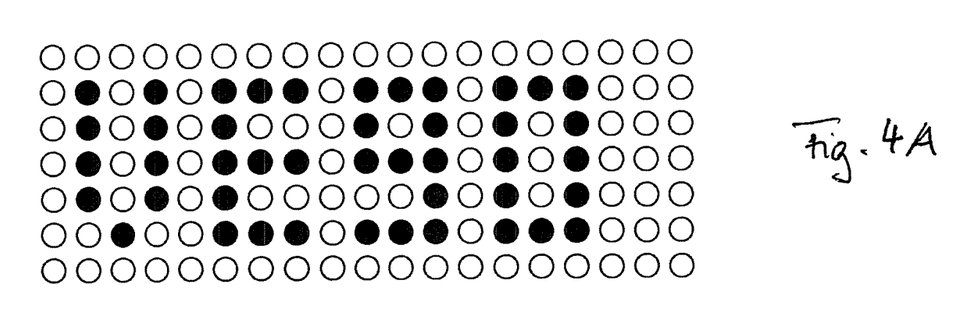
FIGS. 4A to 4D schematically illustrate examples of marks or labels.

FIG. 4A shows a text applied to the semiconductor chip 100 denoting a short version of the chip type. The text is formed by a plurality of dots and reads VE90. Such text may for example be generated by a two-dimensional display having light emitting elements 131 as described above, e.g. a LED or LCD array. By way of example, a LED array having LEDs with a radius of up to 1 μm or a few μm (or LEDs having a larger radius and being coupled to an optical system for downscaling the generated light pattern) may be used.

Figure 4B:
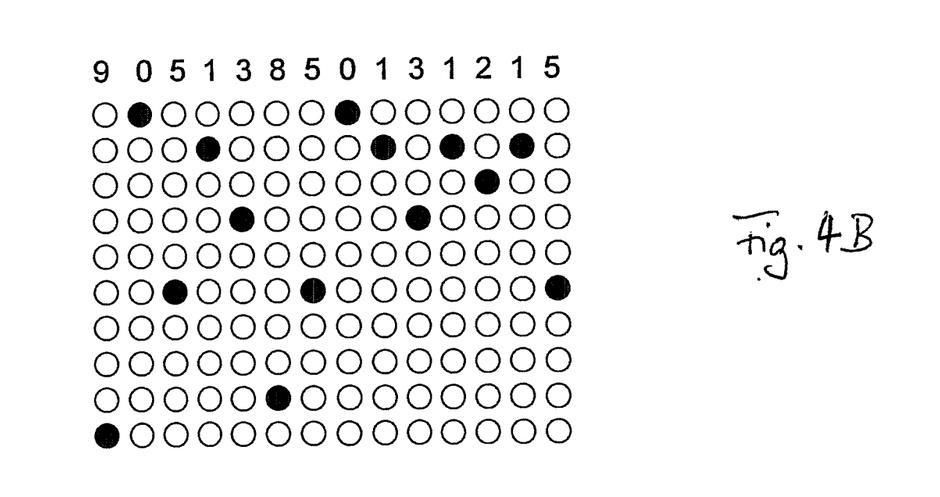
Figure 4C:
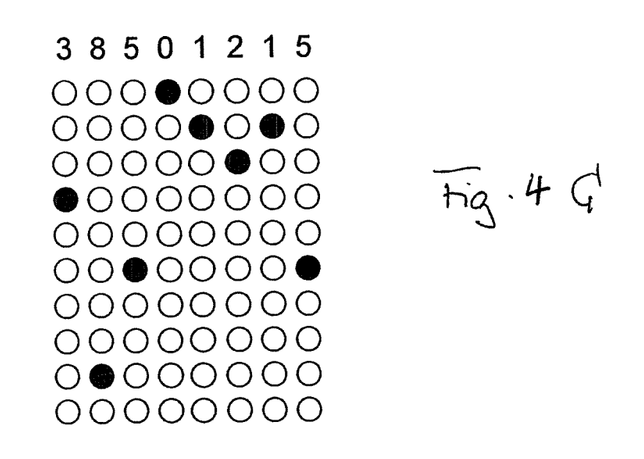
Figure 4D:
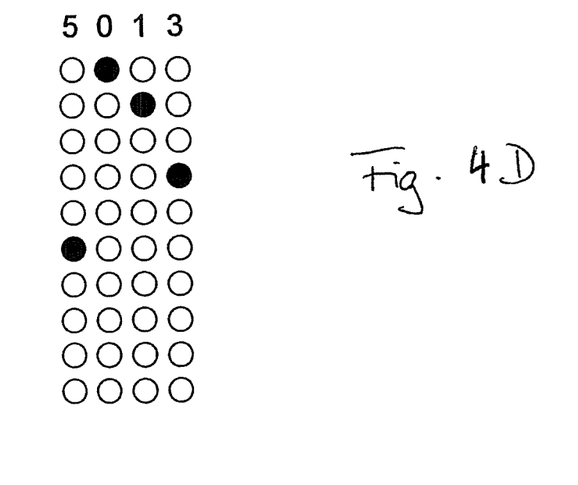

FIG. 4B shows a matrix formulation that corresponds to chip type 905138, wafer number 50, shot number 13 and chip coordinates x=12 and y=15. The information is contained in the positions of the filled circles, the uppermost position corresponding to 0 and the lowermost position corresponding to 9. The upper lines in FIGS. 4B to 4D illustrate the coded information in a text representation. These lines are not applied to the semiconductor chips 100 but are only shown in FIGS. 4B to 4D for explanatory purposes.

FIG. 4C shows a similar representation containing the information of chip type 38, wafer number 50 and chip coordinates x=12 and y=15. This representation may for example be used if there is not enough space on the chip 100 to place the whole information.

FIG. 4D shows a similar representation containing merely the information of wafer number 50 and chip coordinates x=12 and y=15. Such information may, for example, be used for tracing the various chips in the production process.

Figure 5A:
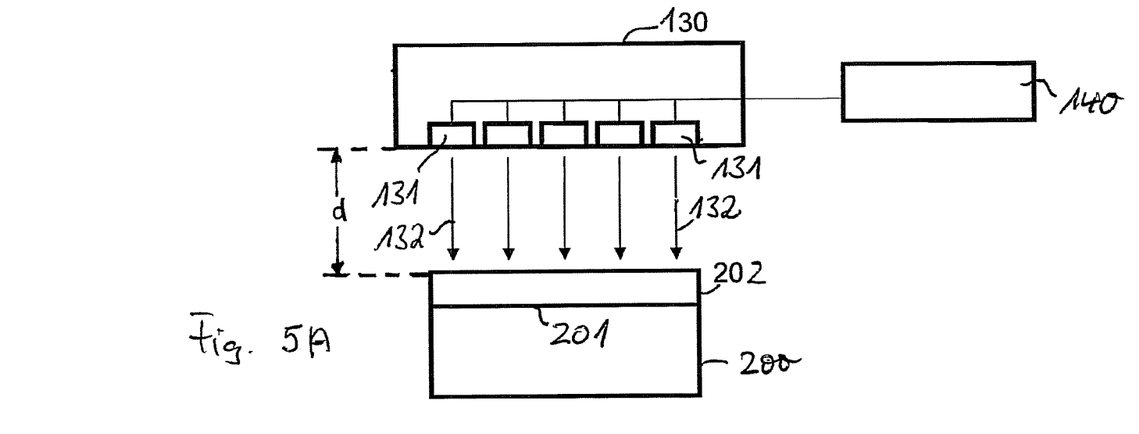
FIGS. 5A to 5C schematically illustrate an embodiment of a method of applying labels or marks onto an object.
Figure 5B:
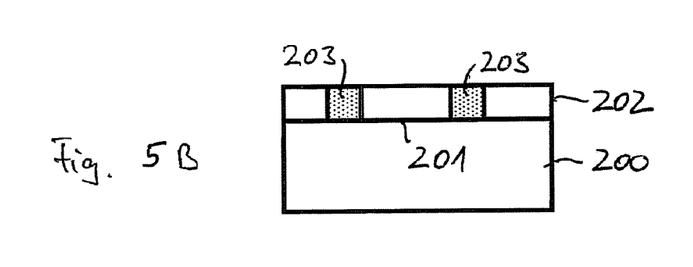
Figure 5C:
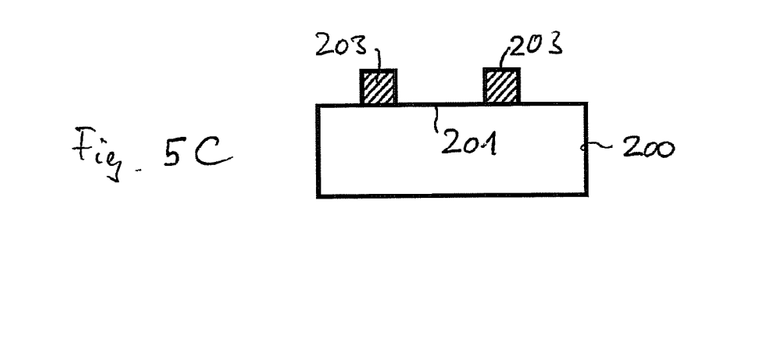

Referring to the foregoing embodiments, it is to be noted that the objects 100 are not restricted to be chips, the light-sensitive layer 102 is not restricted to a photoresist layer and that also single objects 100 may be marked or labeled. FIG. 5A shows an object 200 having a surface 201, which is, by way of example, covered with a light-sensitive layer 202 made e.g. of a silver bromide (AgBr) layer. However, any other suitable light-sensitive material such as e.g. a photoresist may also be used. When the AgBr-layer 202 is exposed by light 132 emitted from light source 130, the light 132 causes the AgBr crystals to dissociate into Ag atoms and Br atoms (so-called photodissociation). In such a photosensitive layer 202, the dissociated Ag atoms cause a darkening of the exposed portions 203. However, because the number of dissociated atoms is usually very small, the darkening is typically not visible and results in a so-called latent image as shown in FIG. 5B. In order to obtain a visible image from the latent image, additional post-processing is required. A so-called developer is used to raise the contrast and causes a visible image. In a subsequent fixing step, the remaining AgBr crystals are removed and a stable mark or label 203 is obtained. FIG. 5C schematically shows the cross section of the resulting labeled object 200 with label 203 applied thereto.

Apart from the exemplary AgBr layer 202, many other photosensitive materials may be used as well, for example photosensitive materials which directly react upon light, i.e. which directly result in a visible contrast without a post-processing. In one embodiment photosensitive materials which need thermal, chemical or physical post-processing may be used. Thermal post-processing may for example be curing of the photosensitive layer 202. It may also be possible to use any of the various photo lithographic methods known in the art. The photosensitive layer 202 may also be composed of materials that adjoin or form new molecules when exposed by light 132. Multiple photosensitive layers 202 may be used to generate marks or labels in different colors.

The above embodiments of methods may for example be used for labeling packaging materials, boxes, various end products, intermediate products, etc. The object 200 may for example be a sheet of paper, cardboard, plastics, ceramics, a semiconductor chip, etc. As described above, it may be possible that the whole surface 201 is to be labeled, or that only a portion of the surface 201 is to be labeled, possibly because other portions of the surface 201 are occupied or reserved so that they may not be used for applying labels or marks, or simply because the area is already large enough for the label or mark.

Figure 6:
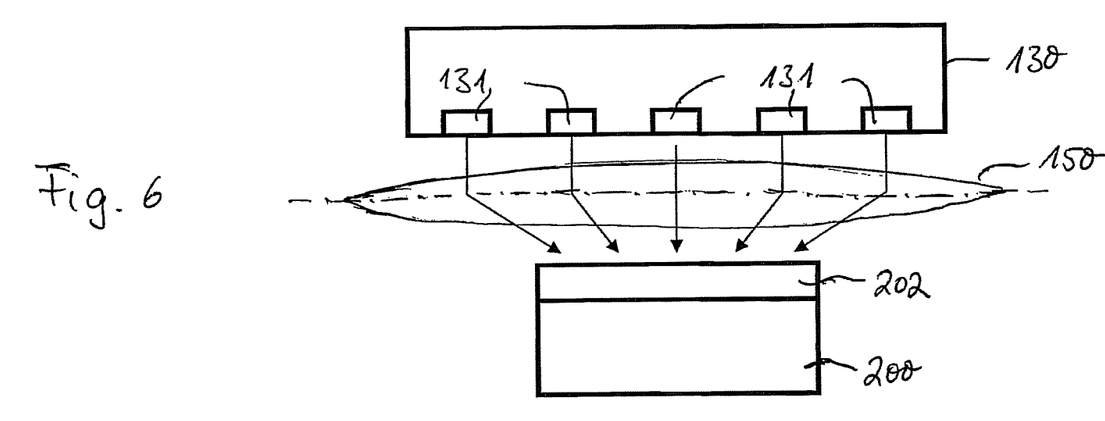
FIG. 6 schematically illustrates a cross-sectional view of an object with a light-sensitive layer and a light source with an optical system according one embodiment.

FIG. 6 schematically illustrates a cross-sectional view of object 200 and a light source 130 combined with an optical system. When single objects 200 are exposed by the light source 130, the light source 130 need only to generate one pattern at each instant. As explained above, this pattern may be scaled-down or scaled-up by an optical element 150 such as e.g. an optical lens.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. This application is intended to cover any adaptations or variations of the specific embodiments discussed herein, and the invention is intended to be limited only by the claims and the equivalence thereof.

What is claimed is:

1. A method of product marking chips of a chip array, comprising:
    applying a first light-sensitive layer reactive to a first wavelength and a second light-sensitive layer reactive to a second wavelength above one another onto the chips;
    individually controlling light emitting elements of an array of light emitting elements forming a light source to generate a first light pattern at the first wavelength which is representative of a first product mark and a second light pattern at a second wavelength which is representative of a second product mark; and
    applying the first product mark to the first light sensitive layer of the chips and applying the second product mark to the second light sensitive layer of the chips by exposing the light-sensitive layer at areas over the chips to the first and second light patterns.

2. The method of claim 1, wherein the first product mark is different from the second product mark.

3. The method of claim 1, wherein the light emitting elements of the light source comprise light emitting diodes forming a two-dimensional display.

4. The method of claim 3, further comprising:
    controlling the two-dimensional display to emit a plurality of different light patterns at different locations across the display.

5. The method of claim 1, further comprising:
    placing an optical element between the light source and the chips.

6. The method of claim 5, wherein the optical element comprises a collecting lens.

7. The method of claim 1, wherein at least one lateral dimension of the array of light emitting elements of the light source is at least the same size as a respective lateral dimension of the chip array.

8. The method of claim 1, further comprising:
    post-processing the light-sensitive layer after exposure to obtain visible first and second prouduct marks.

9. The method of claim 8, wherein the post-processing comprises at least one of curing, heating, developing, and etching.

10. The method of claim 1, wherein the light-sensitive layer is a photoresist layer.

11. A method of marking chips of multiple chip arrays, comprising:
    placing a first chip array onto a carrier;
    applying a light sensitive layer reactive to a first wavelength onto each of the chips of the first chip array;
    applying a mark to each of the chips of the first chip array at the same time;

placing a second chip array onto the carrier;

applying a light sensitive layer reactive to a second wavelength onto each of the chips of the second chip array; and applying a mark to each of the chips of the second chip array at the same time, wherein each mark of each chip of the first chip array is different from the marks of the other chips of the first chip array and each mark of each chip of the second chip array is different from the marks of the other chips of the second chip array;

wherein applying the marks to each of the chips of the first chip array includes:

individually controlling light emitting elements of an array of light emitting elements forming a light source to simultaneously generate a plurality of different light patterns, each light pattern at the first wavelength and representative of a different mark and corresponding to a different chip of the first chip array; and exposing the light sensitive layer of each chip of the first chip array to the corresponding light pattern; and wherein applying the marks to each of the chips of the second chip array includes:

individually controlling the light emitting elements of the array of light emitting elements forming the light source to simultaneously generate a plurality of different light patterns, each light pattern at the second wavelength and representative of a different mark and corresponding to a different chip of the second chip array; and exposing the light sensitive layer of each chip of the second chip array to the corresponding light pattern.

12. The method of claim 11, wherein the light emitting elements of the light source comprise light emitting diodes forming a two-dimensional display.

13. The method of claim 11, further comprising:

placing an optical element between the light source and the chips.

14. The method of claim 13, wherein the optical element comprises a collecting lens.

15. The method of claim 11, wherein at least one lateral dimension of array of light emitting elements of the light source is at least the same as a respective lateral dimension of the first and second chip arrays.

16. A method of product marking chips of a chip array comprising:

applying a first and second light sensitive layers above one another onto the chips of the array, the first light sensitive layer being reactive to a first wavelength and the second light sensitive layer being reactive to a second wavelength, wherein the array comprises a plurality of first chips and a plurality of second chips;

individually controlling light emitting elements of an array of light emitting elements forming a light source to generate, at the first wavelength, first and second light patterns representative of first and second product marks, and to generate, at the second wavelength, third and light patterns representative of third and fourth product marks; and applying the first product mark to the first light sensitive layer of the first plurality of chips, the second product mark to the first light sensitive layer of the second plurality of chips, the third product mark to the second light sensitive layer of the first plurality of chips, the fourth product mark to the second light sensitive layer of the second plurality of chips.

* * * * *